United States Patent
Espiritu et al.

(10) Patent No.: US 8,809,119 B1
(45) Date of Patent: Aug. 19, 2014

(54) INTEGRATED CIRCUIT PACKAGING SYSTEM WITH PLATED LEADS AND METHOD OF MANUFACTURE THEREOF

(71) Applicants: Emmanuel Espiritu, Singapore (SG); Henry Descalzo Bathan, Singapore (SG); Byung Tai Do, Singapore (SG)

(72) Inventors: Emmanuel Espiritu, Singapore (SG); Henry Descalzo Bathan, Singapore (SG); Byung Tai Do, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/896,608

(22) Filed: May 17, 2013

(51) Int. Cl.
*H01L 21/44* (2006.01)
*H01L 21/48* (2006.01)
*H01L 21/50* (2006.01)
*H01L 23/495* (2006.01)

(52) U.S. Cl.
CPC ........ *H01L 23/495* (2013.01); *H01L 23/49537* (2013.01)
USPC .... 438/112; 438/109; 438/615; 257/E21.499; 257/E21.705

(58) Field of Classification Search
CPC .................. H01L 23/495; H01L 23/49537
USPC .......... 438/109, 112, 121, 615; 257/E21.499, 257/E21.509, E21.705
See application file for complete search history.

(56) References Cited

U.S. PATENT DOCUMENTS

| | | |
|---|---|---|
| 6,501,161 B1 | 12/2002 | Lee |
| 6,608,366 B1 | 8/2003 | Fogelson et al. |
| 6,611,047 B2 | 8/2003 | Hu et al. |
| 6,872,599 B1 | 3/2005 | Li et al. |
| 7,195,953 B2 | 3/2007 | Shirasaka |
| 7,264,997 B2 | 9/2007 | Kameyama et al. |
| 7,655,506 B2 | 2/2010 | Tabira |
| 8,329,509 B2 | 12/2012 | Gong et al. |
| 2011/0033977 A1 | 2/2011 | Huening |
| 2013/0249065 A1* | 9/2013 | Do et al. ............... 257/666 |

* cited by examiner

*Primary Examiner* — David S Blum
(74) *Attorney, Agent, or Firm* — Ishimaru & Associates LLP

(57) ABSTRACT

An integrated circuit packaging system and method of manufacture thereof including: providing a leadframe having unprocessed leads; depositing an etch mask on a top surface of the unprocessed leads, the unprocessed leads having the etch mask and an unmasked portions of the top surface; connecting an integrated circuit die to the unprocessed leads; encapsulating with a package body the leadframe, the top surface of the unprocessed leads exposed from the package body; forming side-solderable leads including forming a groove in the unprocessed leads, the groove formed under a portion of the etch mask including forming an overhang of the etch mask over the groove; removing the etch mask; and depositing a plating on the side-solderable leads.

20 Claims, 6 Drawing Sheets

INTEGRATED CIRCUIT PACKAGING SYSTEM WITH PLATED LEADS AND METHOD OF MANUFACTURE THEREOF

TECHNICAL FIELD

The present invention relates generally to an integrated circuit packaging system, and more particularly to a system with plated leads.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

It may be desirable to further reduce package size in additional ways. At the same time, it may be desirable to maintain sufficient structural integrity of the package and of the connections. It may also be desirable to formulate a packaging process designed to meet these objectives. Current packaging solutions can meet some of these objectives but may not be able to meet most, or all, of these objectives.

Thus, a need still remains for a better manufacturing method. In view of the demands for reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a leadframe having unprocessed leads; depositing an etch mask on a top surface of the unprocessed leads, the unprocessed leads having the etch mask and unmasked portions of the top surface; connecting an integrated circuit die to the unprocessed leads; encapsulating with a package body the leadframe, the top surface of the unprocessed leads exposed from the package body; forming side-solderable leads including forming a groove in the unprocessed leads, the groove formed under a portion of the etch mask including forming an overhang of the etch mask over the groove; removing the etch mask; and depositing a plating on the side-solderable leads.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
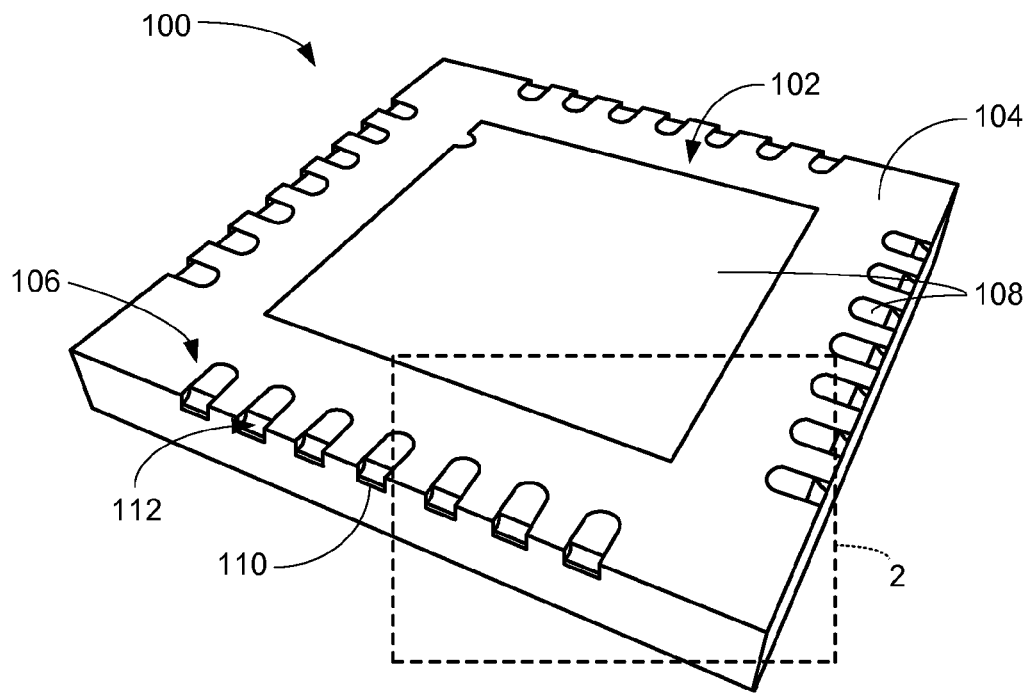
FIG. 1 is an isometric top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. Wavy lines around a figure are used to show that only a portion of a structure is shown.

For expository purposes, the term "horizontal" as used herein is defined as a plane parallel to the plane or surface of the side-solderable leads, regardless of their orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown an isometric top view of an integrated circuit packaging system 100 in an embodiment of the present invention. The isometric top view shows a die pad 102, a package body 104, and side-solderable leads 106. The die pad 102 can have an integrated circuit die (not shown) attached to the bottom side, and encapsulated in the package body 104. The die pad 102 can function to help dissipate heat, act as a ground plane for the integrated circuit die, or a combination thereof. The integrated circuit packaging system 100 can be, for example, a Quad Flat No-Lead package (QFN).

The die pad 102 and the side-solderable leads 106 are embedded in the package body 104 while also being exposed from the package body 104. The package body 104 can protect the integrated circuit die and can be a material such as epoxy molding compound, resin, or other non-conductive material. The integrated circuit die can be connected to the side-solderable leads 106 with interconnects (not shown) such as bond wires.

The die pad 102 and the side-solderable leads 106 can be made from a metal such as copper and can have plating 108 on most exposed surfaces of the die pad 102 and the side-solderable leads 106. The plating 108 functions as a solder-wettable surface for connection through solder to a circuit board or other system, and can be composed of materials such as tin, a eutectic compound, or other solder-wettable and conductive material. The plating 108 can have a thickness of 5-20 μm, and the side-solderable leads 106 can have a pitch that conforms to JEDEC standards, or between 0.4 mm and 1.0 mm.

The side-solderable leads 106 are exposed from the package body 104 on the top and side surfaces. An unplated portion 110 of the side-solderable leads 106 is visible coplanar with the side of the package body 104. The other exposed surfaces of the side-solderable leads 106, including a groove 112 in the edge of the side-solderable leads 106, are covered in the plating 108. The side-solderable leads 106 have a greater surface area for solder to contact due to the extra surface area provided by the groove 112, resulting in a stronger and more reliable connection against multi-directional stresses once mounted or soldered on a board. The side-solderable leads 106 are for connection to a next-level system or board.

Figure 2:
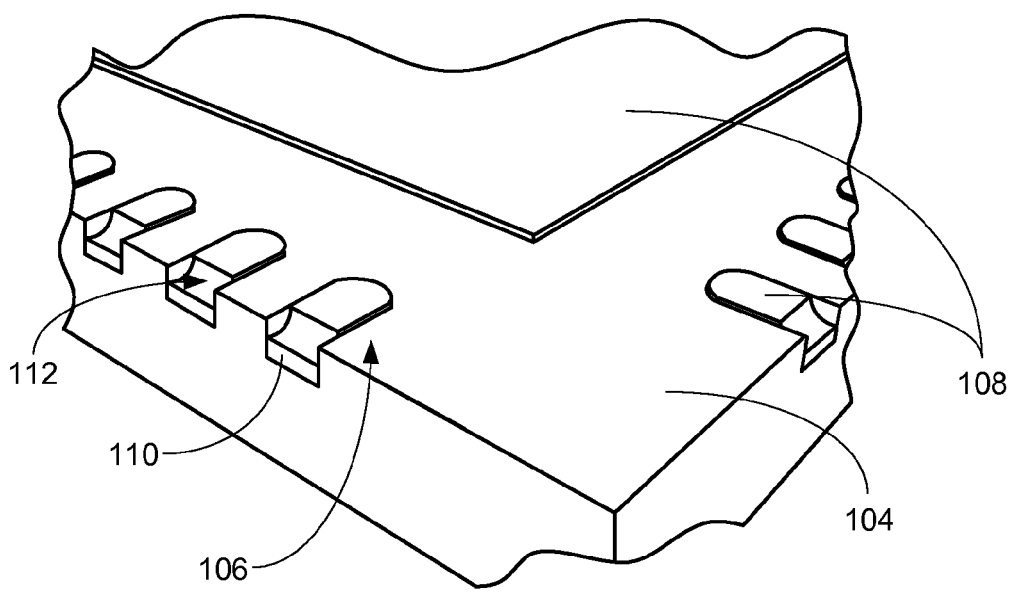
FIG. 2 is a detailed view of FIG. 1 within the inset depicted by the dotted rectangle 2 of FIG. 1.

Referring now to FIG. 2, therein is shown a detailed view of FIG. 1 within the inset depicted by the dotted rectangle 2 of FIG. 1. In this view, the side-solderable leads 106 can be seen in detail, and the groove 112 can be seen in the side of each of the side-solderable leads 106. The groove 112 can have a curved shape or a combination of flat angled surfaces and curved surfaces, and can end at the unplated portion 110 of the side-solderable leads 106. The wavy lines around FIG. 2 are used to show that only a portion of the structures are being shown.

For illustrative purposes, the plating 108 is shown as above the package body 104, but it is understood that the plating 108 can be in a different position relative to the package body 104. For example, the plating 108 can be coplanar with the surface of the package body 104, or the plating 108 can be recessed below the surface of the package body 104. It is also understood that the thickness of the plating 108 is exaggerated for visual effect, and that the thickness of the plating 108 can be lower than what is shown.

Figure 3:
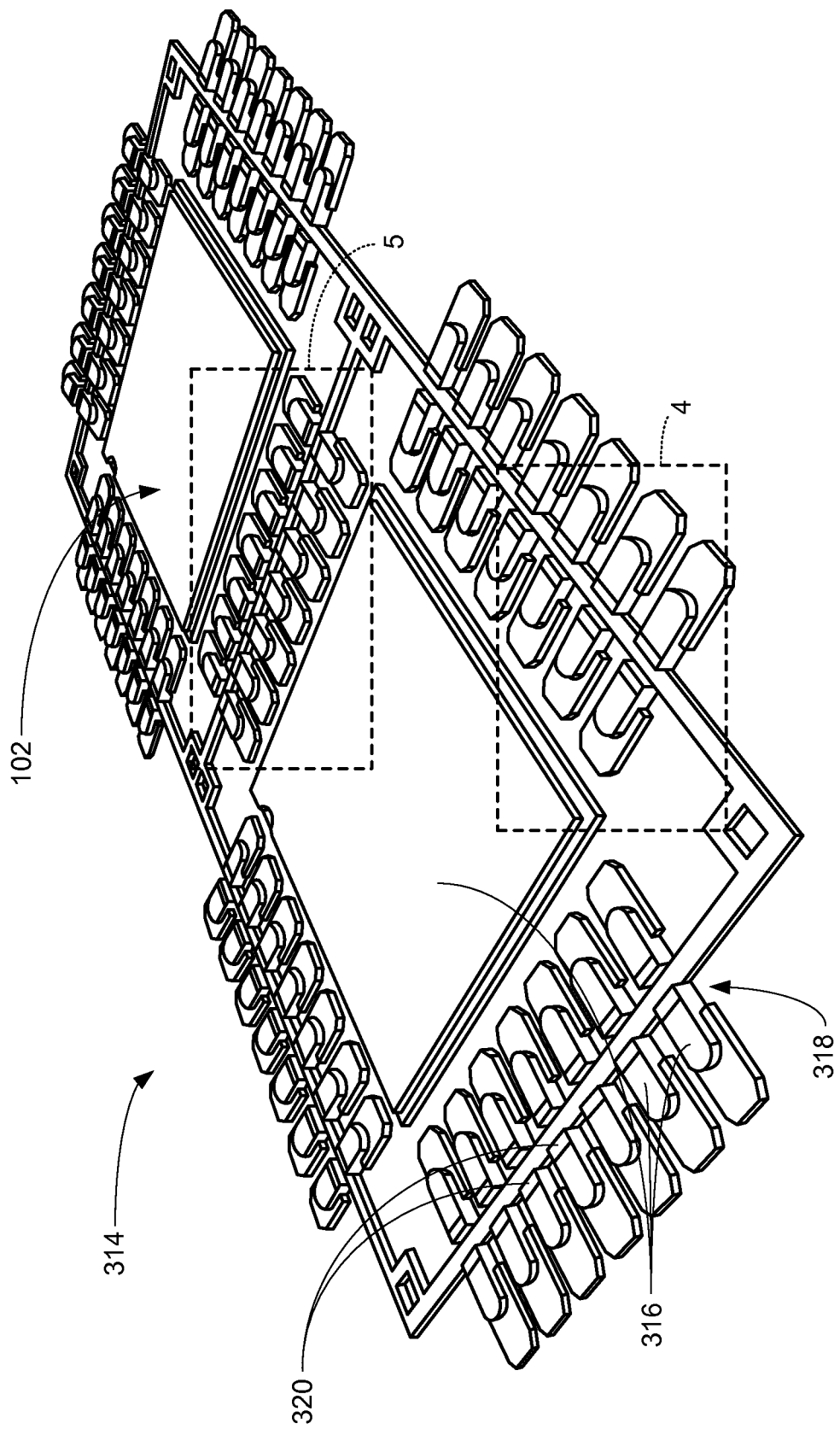
FIG. 3 is an isometric top view of a leadframe in a masking phase of manufacture.

Referring now to FIG. 3, therein is shown an isometric top view of a leadframe 314 in a masking phase of manufacture. In this view is the leadframe 314 sufficient for manufacturing two of the integrated circuit packaging system 100 of FIG. 1, but it is understood that the leadframe 314 can be of any size. For example, the leadframe 314 can be sufficient for manufacturing 4, 6, 9, or any other number of the integrated circuit packaging system 100.

The leadframe 314 is selectively covered with an etch mask 316 on unprocessed leads 318 of the leadframe 314, leaving unmasked portions 320 of the unprocessed leads 318 exposed. The unmasked portions 320 of the unprocessed leads 318 can be at the edge of the unprocessed leads 318. The etch mask 316 will protect the covered portions of the leadframe 314 from a later etching step, allowing the leadframe 314 to be selectively etched through only the unmasked portions 320 of the unprocessed leads 318. The etch mask 316 can be a single layer or multiple layers of metal, protective organic material, or a combination of metal and organic material (e.g., Blue Ink, epoxy, resin, etc.), for example. The unprocessed leads 318 of the leadframe 314 are used as a base to form the side-solderable leads 106 of FIG. 1 after further processing.

The etch mask 316 can be applied using different processes depending on what material is used for the etch mask 316. For example, the etch mask 316 can be deposited using a process such as masking followed by chemical or physical vapor deposition, masking followed by electrochemical or electroless plating, masking and dipping, printing, or dispensing.

For illustrative purposes, the etch mask 316 is shown covering a portion of the unprocessed leads 318 in a shape that is flat at one end and curved at the other end, but it is understood that this is only an example, and that the shape of the etch mask 316 can be different. For example, the etch mask 316 can be in the shape of a semi-circle, a triangle, or other shape, and the etch mask 316 can have an edge that is wavy rather than straight.

The die pad 102 is shown as unconnected to the rest of the leadframe 314, but it is understood that this detail has been omitted for clarity. The die pad 102 can be connected to the rest of the leadframe 314 through tie bars or dam bars, for example. The die pad 102 is shown without any of the unmasked portions 320, but the die pad 102 can have the unmasked portions 320 if a side-solderable feature is desired on the die pad 102.

Figure 4:
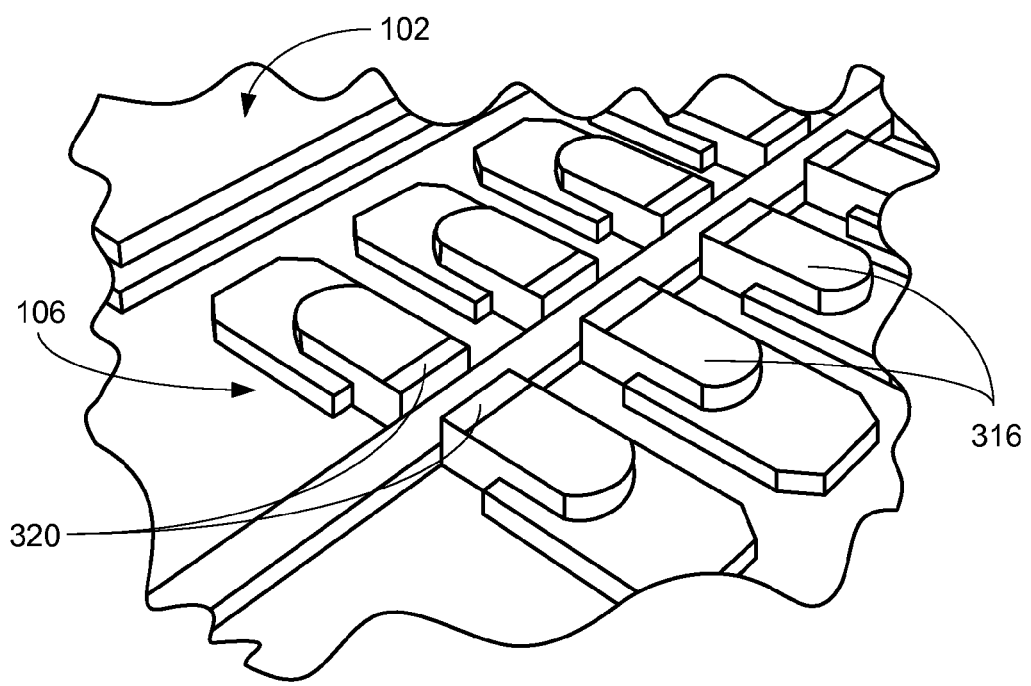
FIG. 4 is a detailed view of FIG. 3 within the inset depicted by the dotted rectangle 4 of FIG. 3.

Referring now to FIG. 4, therein is shown a detailed view of FIG. 3 within the inset depicted by the dotted rectangle 4 of FIG. 3. In this view, the unprocessed leads 318 with the unmasked portions 320 and the etch mask 316 can be seen in more detail. The etch mask 316 can be selectively deposited on the top of the unprocessed leads 318, leaving the unmasked portions 320 of the unprocessed leads 318 exposed.

Figure 5:
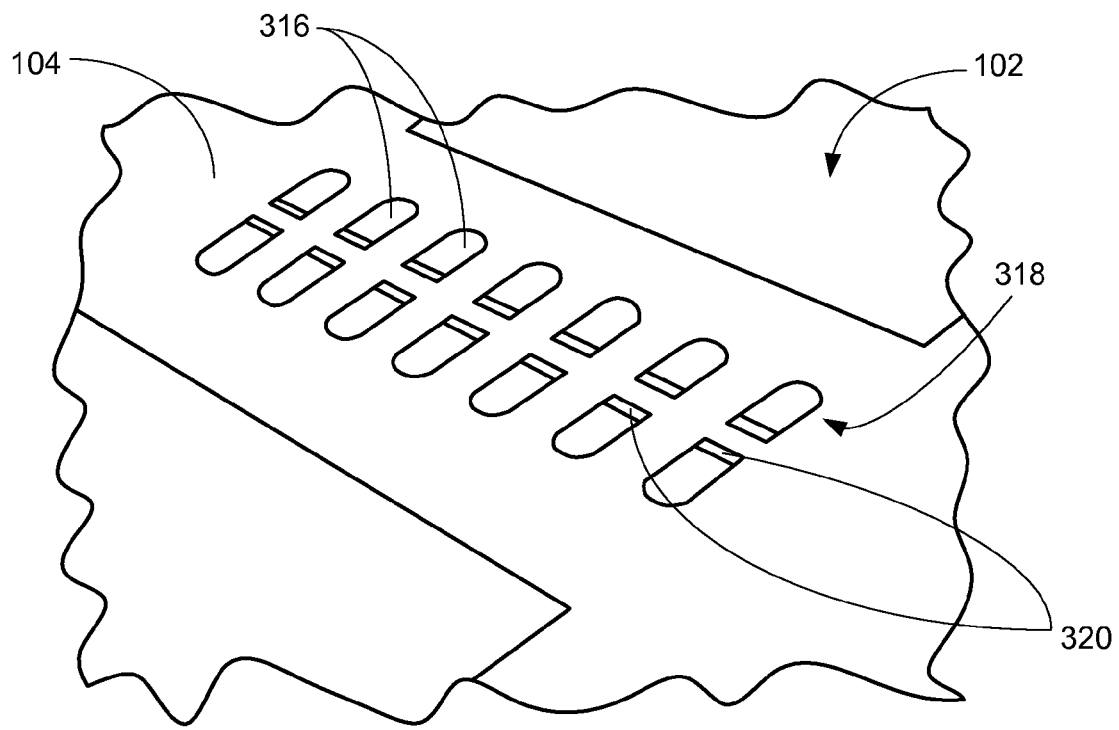
FIG. 5 is an isometric top view of the unprocessed leads of FIG. 3 within the inset depicted by the dotted rectangle 5 of FIG. 3 in an encapsulation phase of manufacture.

Referring now to FIG. 5, therein is shown an isometric top view of the unprocessed leads 318 of FIG. 3 within the inset depicted by the dotted rectangle 5 of FIG. 3 in an encapsulation phase of manufacture. In this view, the package body 104 has been applied to cover most of the leadframe 314 of FIG. 3 while leaving the top of the unprocessed leads 318 and the die pad 102 exposed. Though not visible, the integrated circuit die (not shown) is mounted on the die pad 102 and electrically connected to the unprocessed leads 318 prior to encapsulation.

The package body 104 can be molded on the integrated circuit die and the leadframe 314 such that the package body 104 is coplanar with the surface of the unprocessed leads 318 and the die pad 102. The top surface of the unprocessed leads 318 can be exposed with the rest of the unprocessed leads 318 embedded in the package body 104. Exposed from the package body 104 on the top surface of the unprocessed leads 318 is the etch mask 316 and the unmasked portions 320. This encapsulation step can be performed by a process such as injection molding, compression molding, or film assist molding, for example.

The package body 104 is described as being molded on the leadframe 314 after selective application of the etch mask 316, but it is understood that the process can be modified. For example, the package body 104 can be molded on the leadframe 314 and the integrated circuit die first and then the etch mask 316 can be selectively applied to the exposed portions of the leadframe 314.

Figure 6:
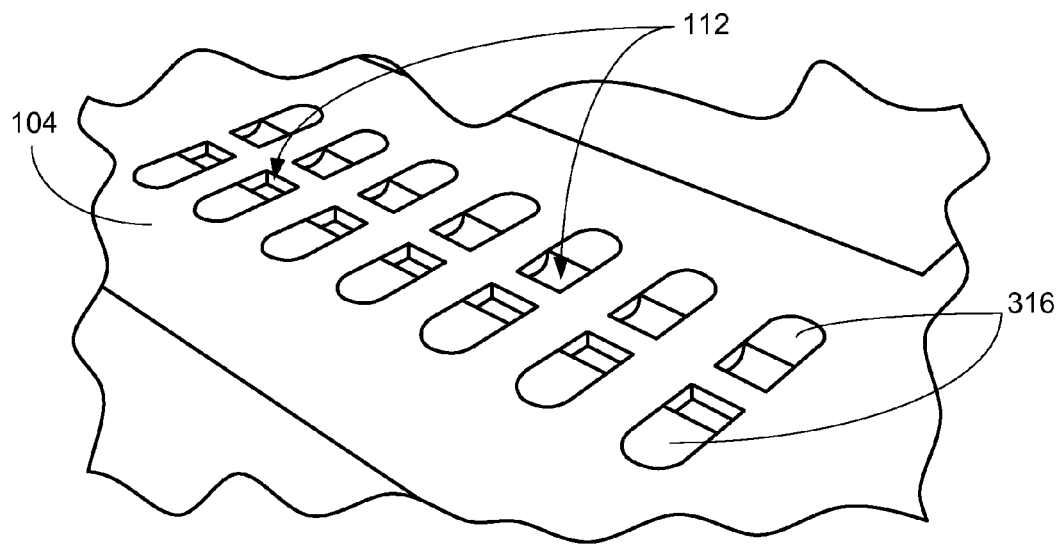
FIG. 6 is the structure of FIG. 5 in an etching phase of manufacture.

Referring now to FIG. 6, therein is shown the structure of FIG. 5 in an etching phase of manufacture. The unprocessed leads 318 of FIG. 3 have been etched, and a portion of the etch mask 316 has been removed.

Subjected to an etching process, the unmasked portions 320 of FIG. 4 will be removed from the top surface downwards. For example, an isotropic etching process will etch at equal rates in all directions, and will etch under a portion of the etch mask 316 as the etchant eats into the sidewall of the forming groove. This etching process will form a curved depression and leave an overhang or a dangling piece of the etch mask 316 over the groove 112, sometimes called "dog ear plating" if plating is used as the etch mask 316. The etchant is selected to only etch into the unmasked portions 320 and not damage the package body 104 or etch mask 316. For example, the unmasked portions 320 being at the edge of the unprocessed leads 318 means that the groove 112 is also at the edge of the leads, with one edge up against the package body 104 and, before removal of the overhang, the opposite edge under the overhang of the etch mask 316.

The etching process can be controlled to etch through roughly half the height of the unprocessed leads 318, forming the curved shape of the groove 112. Following the etching step, the overhanging piece of the etch mask 316 is removed. For example, a high pressure deflash process can be used to remove the overhang. This results in the groove 112 being larger when viewed from the top than the original size of the unmasked portions 320 because the etch mask 316 is partially removed. The etch mask 316 surface area will be smaller after removal of the overhang.

It has been discovered that the groove 112 formed through the etching process utilizing the etch mask 316 improves overall connectivity. Because no sawing is done to form the groove 112, there is no burr created, and no reduction in reliability due to burr formed as a natural result of a sawing process. In addition, there is no physical stress placed on the unprocessed leads 318 during formation of the groove 112 from the etching process, unlike a sawing process, which also improves reliability.

It has also been discovered that selective application of the etch mask 316 on the unprocessed leads 318 provides groove design flexibility. Because the groove 112 takes a shape as a result of the selective application of the etch mask 316, which can be patterned to nearly any reasonable shape, the groove 112 can be designed to a greater number of shapes as compared to sawing the groove 112. This greater flexibility can, for example, allow for an increase the amount of surface area for later application of solder and a better connection.

It has been discovered that selective application of the etch mask 316 followed by an etching process provides greater control over the dimensions of the groove 112 than a sawing process would. All processes are subject to some deviation, but because the etching process can be controlled more tightly than a saw, the tolerance to deviations to consider are smaller, which leads to less waste, greater flexibility, and greater control over the dimensions of the groove 112.

Figure 7:
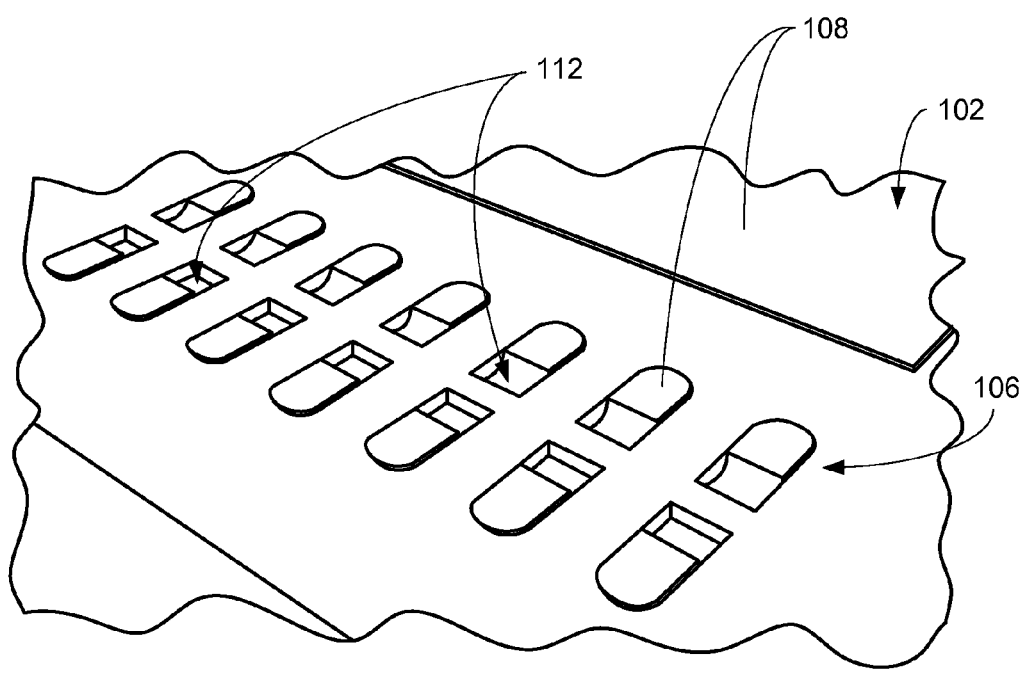
FIG. 7 is the structure of FIG. 6 in a plating phase of manufacture.

Referring now to FIG. 7, therein is shown the structure of FIG. 6 in a plating phase of manufacture. The plating phase follows the etching phase and removal of the etch mask 316 of FIG. 3.

The etch mask 316 can be fully removed in order to prepare the side-solderable leads 106 and the die pad 102 for plating. Following the removal of the overhang of the etch mask 316, the remainder of the etch mask 316 can be removed using a dry buffing process, which also serves to planarize the surface. An alternative process to remove the overhang and the rest of the etch mask 316 is to replace the high pressure deflash with a chemical deflash followed by stripping the plating. Another alternative process is to remove both the overhang of the etch mask 316 and the remainder of the etch mask 316 with a single dry buffing process. Another possibility is to strip the plating without a separate deflashing step, through, for example, chemical mechanical planarization (CMP), which can perform a deflashing function while also removing the etch mask.

Once the etch mask 316 is removed, all features of the side-solderable leads 106, including the groove 112, and the die pad 102 exposed from the top of the package body 104 are covered with the plating 108 using a plating process such as electroplating, electroless plating, electrochemical plating, printing, sputtering, or some form of vapor deposition. For example, the side-solderable leads 106 can have the plating 108 deposited directly on the bare metal of the groove 112 and an upper surface of the side-solderable leads 106.

For illustrative purposes, the plating 108 is shown as significantly raised from the surface of the package body 104, but it is understood that this is for visual effect. The plating 108 can be applied at various thicknesses and is not limited to any particular thickness. The choice of thickness can depend on the composition of the plating 108.

It has been discovered that deposition of the plating 108 on the bare metal of the side-solderable leads 106 leads to a better solder connection. Deposition of the plating 108 directly on the copper of the side-solderable leads 106 allows for a better bond between the plating 108 and the side-solderable leads 106, which can improve the strength of the solder connection. For example, fewer points where there is a possibility of delamination between layers will increase reliability and improve the strength of a connection.

Figure 8:
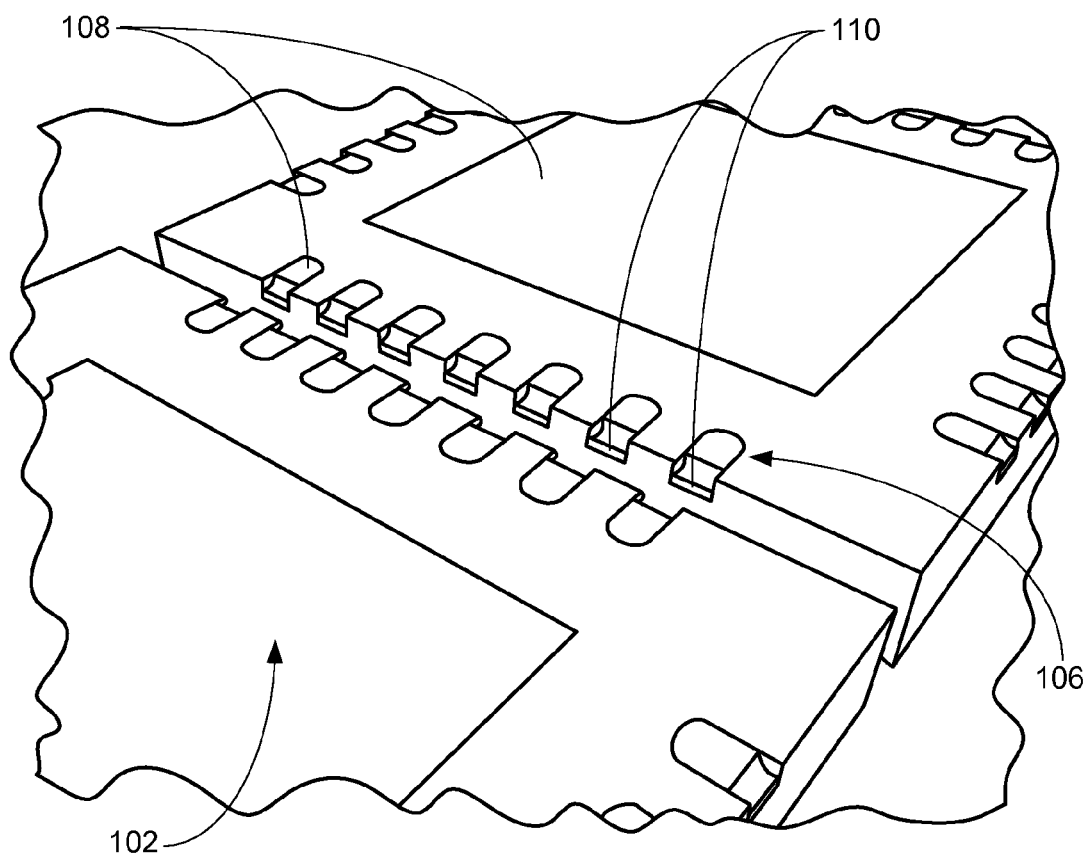
FIG. 8 is the structure of FIG. 7 in a singulation phase of manufacture.

Referring now to FIG. 8, therein is shown the structure of FIG. 7 in a singulation phase of manufacture. After the plating 108 has been deposited or applied on the side-solderable leads 106 and the die pad 102, the integrated circuit packaging system 100 can be formed by a singulation process which cuts between rows of the side-solderable leads 106. The singulation process can expose the unplated portion 110 of the side-solderable leads 106 at the side of the integrated circuit packaging system 100.

Figure 9:
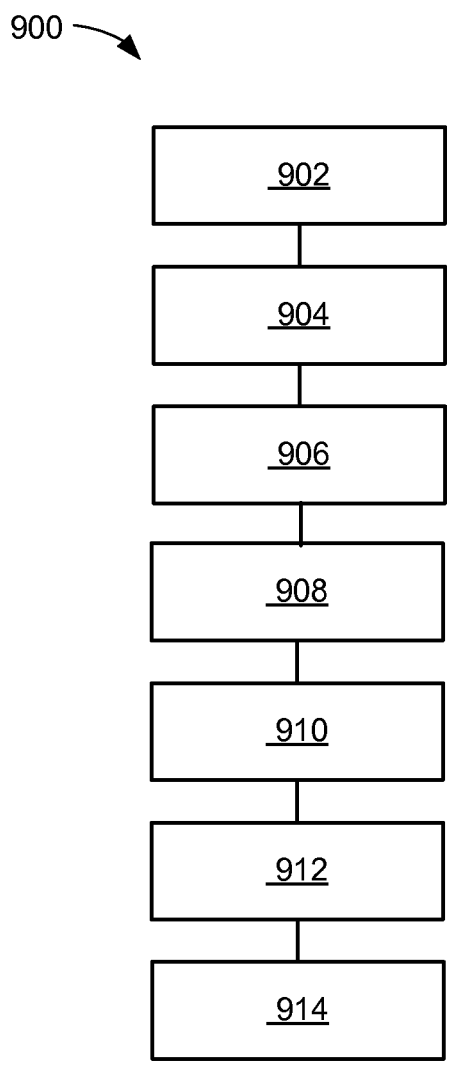
FIG. 9 is a flow chart of a method of manufacture of an integrated circuit packaging system in a further embodiment of the present invention.

Referring now to FIG. 9, therein is shown a flow chart of a method 900 of manufacture of an integrated circuit packaging system in a further embodiment of the present invention. The method 900 includes: providing a leadframe having unprocessed leads in a block 902; depositing an etch mask on a top surface of the unprocessed leads, the unprocessed leads having the etch mask and unmasked portions of the top surface in a block 904; connecting an integrated circuit die to the unprocessed leads in a block 906; encapsulating with a package body the leadframe, the top surface of the unprocessed leads exposed from the package body in a block 908; forming side-solderable leads including forming a groove in the unprocessed leads, the etch mask having an overhang over the groove in a block 910; removing the etch mask in a block 912; and depositing a plating on the side-solderable leads in a block 914.

Thus, it has been discovered that the integrated circuit packaging system of the present invention furnishes important and heretofore unknown and unavailable solutions, capabilities, and functional aspects for reliable manufacturing of QFN packages.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a leadframe having unprocessed leads;
   depositing an etch mask on a top surface of the unprocessed leads, the unprocessed leads having the etch mask and unmasked portions of the top surface;
   connecting an integrated circuit die to the unprocessed leads;
   encapsulating with a package body the leadframe, the top surface of the unprocessed leads exposed from the package body;
   forming side-solderable leads including forming a groove in the unprocessed leads, the groove formed under a portion of the etch mask including forming an overhang of the etch mask over the groove;
   removing the etch mask; and
   depositing a plating on the side-solderable leads.

2. The method as claimed in claim 1 wherein removing the etch mask includes applying a dry buffing process to the etch mask for removing the overhang and a remainder of the etch mask.

3. The method as claimed in claim 1 wherein removing the etch mask includes:
   applying a high pressure deflash process to the overhang; and
   applying a dry buffing process to the etch mask.

4. The method as claimed in claim 1 wherein removing the etch mask includes:
   applying a chemical deflash process to the overhang and the top surface; and
   stripping the etch mask.

5. The method as claimed in claim 1 wherein removing the etch mask includes applying a chemical mechanical planarization process to the etch mask.

6. A method of manufacture of an integrated circuit packaging system comprising:
   providing a leadframe having unprocessed leads;
   depositing an etch mask on a top surface of the unprocessed leads, the unprocessed leads having the etch mask and unmasked portions of the top surface;
   connecting an integrated circuit die to the unprocessed leads;
   encapsulating with a package body the leadframe and the integrated circuit die, the top surface of the unprocessed leads exposed from the package body;
   etching through the unmasked portions of the top surface for forming side-solderable leads from the unprocessed leads including forming a groove in the unprocessed leads, the groove formed under a portion of the etch mask including forming an overhang of the etch mask over the groove;
   removing the etch mask; and
   depositing a plating on the side-solderable leads.

7. The method as claimed in claim 6 wherein providing the leadframe includes providing the leadframe having a die pad.

8. The method as claimed in claim 6 wherein depositing the etch mask on a top surface includes depositing the etch mask with the unmasked portions at the edge of the top surface.

9. The method as claimed in claim 6 wherein etching through the unmasked portions of the top surface includes applying an isotropic etching process.

10. The method as claimed in claim 6 wherein encapsulating with the package body includes encapsulating the integrated circuit die.

11. A method of manufacture of the integrated circuit packaging system comprising:
    providing a leadframe having a die pad and unprocessed leads;
    depositing an etch mask on a top surface of the unprocessed leads, the unprocessed leads having the etch mask and an unmasked portions of the top surface;
    connecting the integrated circuit die to the unprocessed leads;
    encapsulating with a package body the leadframe and the integrated circuit die, the top surface of the unprocessed leads exposed from the package body;
    etching through the unmasked portions of the top surface for forming side-solderable leads from the unprocessed leads including forming a groove in the unprocessed leads, the groove formed under a portion of the etch mask including forming an overhang of the etch mask over the groove;
    removing the etch mask; and
    depositing a plating on the side-solderable leads.

12. The method as claimed in claim 11 wherein connecting the integrated circuit die to the unprocessed leads includes connecting bond wires between the integrated circuit die and the unprocessed leads.

13. The method as claimed in claim 11 wherein depositing the plating includes depositing tin or a eutectic plating.

14. The method as claimed in claim 11 wherein connecting the integrated circuit die to the unprocessed leads includes mounting the integrated circuit die on the die pad.

15. The method as claimed in claim 11 further comprising singulating the leadframe and the package body for forming the integrated circuit packaging system.

16. The method as claimed in claim 11 further comprising:
   singulating the leadframe and the package body for forming the integrated circuit packaging system; and
wherein connecting the integrated circuit die to the unprocessed leads includes:
   mounting the integrated circuit die on the die pad; and
   connecting bond wires between the integrated circuit die and the unprocessed leads.

17. The method as claimed in claim 16 wherein depositing the etch mask on a top surface of the unprocessed leads includes depositing the etch mask on the unprocessed leads after encapsulating the leadframe with the package body.

18. The method as claimed in claim 16 wherein depositing the plating on the side-solderable leads includes depositing the plating directly on an upper surface of the side-solderable leads.

19. The method as claimed in claim 16 wherein depositing the etch mask includes depositing a metal, organic material, or combination of metal and organic material.

20. The method as claimed in claim 16 wherein depositing the etch mask includes depositing the etch mask with an electroplating, electroless plating, or printing process.

* * * * *